(12) United States Patent
King et al.

(10) Patent No.: US 10,180,466 B2
(45) Date of Patent: Jan. 15, 2019

(54) SYSTEMS AND METHODS FOR DETERMINING A ROOT CAUSE OF AN ISSUE IN AN ELECTRICAL GRID

(71) Applicant: Southern Company, Atlanta, GA (US)

(72) Inventors: Robert D. King, Atlanta, GA (US); Joshua Ashcraft, Atlanta, GA (US); Jamie R. Meaders, Atlanta, GA (US); Tommy Jamison, Jr., Atlanta, GA (US); Ravikanth C. Paruchuri, Atlanta, GA (US); Wesley M. Granade, Atlanta, GA (US); Mitch A. Cason, Atlanta, GA (US); Derl W. Rhoades, Birmingham, AL (US); Brandon Lundy, Birmingham, AL (US)

(73) Assignee: Southern Company, Atlanta, GA (US)

( * ) Notice: Subject to any disclaimer, the term of this patent is extended or adjusted under 35 U.S.C. 154(b) by 35 days.

(21) Appl. No.: 15/413,547

(22) Filed: Jan. 24, 2017

(65) Prior Publication Data

US 2018/0210038 A1 Jul. 26, 2018

(51) Int. Cl.
*G01R 31/40* (2014.01)
*G01R 19/04* (2006.01)

(52) U.S. Cl.
CPC ............. *G01R 31/40* (2013.01); *G01R 19/04* (2013.01)

(58) Field of Classification Search
CPC ................................ G01R 31/40; G01R 19/04
USPC .......... 324/764.01, 126–128, 76.11, 89, 500, 324/508–511, 435, 458, 714, 723; 700/295, 22, 275, 286, 292, 291, 287

See application file for complete search history.

(56) References Cited

U.S. PATENT DOCUMENTS

| 7,227,462 | B2 | 6/2007 | Spencer |
| 7,496,430 | B2 | 2/2009 | Mak |
| 8,774,975 | B2 | 7/2014 | DiLuciano et al. |
| 8,928,489 | B2 | 1/2015 | DiLuciano et al. |
| 9,467,754 | B1 | 10/2016 | Sparks et al. |
| 2012/0173174 | A1* | 7/2012 | Gaarder ............... G01R 31/086 702/58 |
| 2012/0268271 | A1* | 10/2012 | McMullin ............. H04L 43/028 340/540 |
| 2013/0049764 | A1* | 2/2013 | Koliwad ............... G01R 31/086 324/522 |
| 2013/0096983 | A1* | 4/2013 | Forbes ............... G06Q 30/0202 705/7.31 |

(Continued)

*Primary Examiner* — Melissa Koval
*Assistant Examiner* — Trung Nguyen
(74) *Attorney, Agent, or Firm* — Troutman Sanders LLP; Dustin B. Weeks; Micah B. Hensley

(57) ABSTRACT

An exemplary embodiment of the present invention provides a method for determining root causes of issues in an electrical grid. The method includes receiving local data from each of a plurality of meters. The local data may be indicative of voltage levels measured by the plurality of meters. The method also includes identifying abnormalities in the received local data. An abnormality is indicated by local data indicative of a voltage level that is outside of a predetermined range of acceptable levels. The method further includes associating each of the identified abnormalities with a respective meter and a geographic location of the respective meter and analyzing each of the identified abnormalities according to a predetermined set of evaluation factors to determine a root cause.

18 Claims, 2 Drawing Sheets

(56) References Cited

U.S. PATENT DOCUMENTS

2014/0085105 A1    3/2014   Vaswani et al.
2015/0115742 A1    4/2015   Willis et al.
2016/0077164 A1    3/2016   Toyoshima et al.
2016/0276831 A1    9/2016   Karlak et al.

\* cited by examiner

SYSTEMS AND METHODS FOR DETERMINING A ROOT CAUSE OF AN ISSUE IN AN ELECTRICAL GRID

TECHNICAL FIELD OF THE INVENTION

The various embodiments of the present disclosure relate generally to determining a cause of an issue in an electrical grid. More particularly, the various embodiments of the present invention are directed to identifying and diagnosing an issue, or a potential issue, in an electrical grid.

BACKGROUND OF THE INVENTION

Electrical utilities are required to adhere to standards set by various regulatory entities, including public service commissions, public utility commissions, and industry standards. Some of these standards address an optimal service voltage. To measure service voltage, electrical utilities commonly use meters at customer locations, as well as Advanced Metering Infrastructure ("AMI"), which allows a utility to remotely read and control meters. Electrical utilities face several challenges in meeting these regulatory standards including a huge number of meters and an even larger amount of data associated with the values measured by each meter, which can number in the hundreds of millions of data points per weeks. Due to the massive number of voltage readings, inspection of each out-of-range reading by a meter would be impractical, if not impossible. Additionally, existing practices used by electrical utilities generally require a technician to manually inspect a problematic meter, as well as the electrical grid in the near vicinity of the problematic meter. This is because several components of the electrical grid can affect the voltage readings of meters.

Electrical devices within an electrical grid are designed to operate within particular voltage ranges; operation outside of these designated voltage ranges may be detrimental to an electrical device, causing the device to operate less efficiently, age faster, or even fail. Some devices may fail for other reasons, such as a device that has outlived its useful life. Regardless, a failure of an electrical device or some other non-functionality within the electrical grid may cause localized or wide-spread power loss to customers.

Furthermore, electrical utilities commonly employ multiple types of technicians, who possess different skill levels and are outfitted with different tools. Electrical utilities frequently assign particular tasks to a given technician depending on the issue that requires attention and the type of technician. A technician sent to inspect a meter that has reported an out-of-range voltage may find that he or she does not have the correct tools or expertise for the issue causing the out-of-range readings at the meter. The electrical utility may then be required to send a second technician to correct the issue. This inefficiency can prove costly in terms of resources and money for an electrical utility. Additional expense can be incurred by an electrical utility due to false positives, which may be reported by some meters.

Moreover, existing practices of electrical utilities generally require an electrical device to fail before it can be identified and repaired or replaced. This may cause a power loss for customers.

Therefore, there is a desire for a method and system to identify and diagnose an issue in an electrical grid without manually inspecting individual meters. There is a further desire for a method and system to identify and diagnose an issue in an electrical grid prior to its occurrence, such that the issue may be repaired prior to causing a power loss to customers. Various embodiments of the present invention address these desires.

BRIEF SUMMARY OF THE INVENTION

The present invention relates to identifying and diagnosing an issue in an electrical grid with the use of data recorded by a plurality of meters within the electrical grid. An exemplary embodiment of the present invention provides a method for determining root causes of issues in an electrical grid. The method may include receiving, from each of a plurality of meters, local data that is indicative of voltage levels measured by the plurality of meters, and identifying abnormalities in the received local data. An abnormality may be indicated by local data indicative of a voltage level that is outside of a predetermined range of acceptable levels. The method may also include associating each of the identified abnormalities with a respective meter and a geographic location of the respective meter, and analyzing each of the identified abnormalities according to a predetermined set of evaluation factors to determine a root cause.

In certain embodiments, each meter may transmit local data that the meter recorded over a specified time period, and the local data can include a maximum voltage value, a minimum voltage value, and an average voltage value.

In some embodiments, analyzing each of the identified abnormalities according to the predetermined set of evaluation factors includes identifying whether each of the identified abnormalities is associated with a maximum voltage value, a minimum voltage value, and/or an average voltage value; identifying a severity and duration of each of the identified abnormalities; and associating each of the identified abnormalities from a particular meter in the plurality of meters with each of the identified abnormalities from other meters in the plurality of meters in a predetermined geographic vicinity. The predetermined geographic vicinity may be predetermined by geography and a layout of an electrical grid.

In some embodiments, the method may also include filtering out false positive values by limiting identification of the root cause to only those abnormalities that exist for at least a predetermined time requirement.

In certain embodiments, the local data may be further indicative of a model of each of the plurality of meters, and the root cause may be a meter that requires replacement if the model of the meter is outdated.

In some embodiments, the root cause may be a meter that requires reprogramming if the average voltage value transmitted by the meter is not between the minimum voltage value and maximum voltage value transmitted by the meter.

In some embodiments, the root cause may be voltage supplied from a transmission line to a pole- or pad-mount substation if a plurality of meters reporting abnormalities is served from a point that does not provide voltage regulation.

In some embodiments, the root cause may be a malfunctioning transformer if at least a predetermined percentage of the meters serviced by a particular transformer experience an abnormality.

In certain embodiments, the root cause may be a malfunctioning voltage regulating device if at least a first predetermined number of transformers service at least a second predetermined number of meters that experience an abnormality.

In some embodiments, the root cause may be impending failure of a transformer if a plurality of meters experiences a sudden increase in voltage by at least a predetermined amount and if each of the plurality of meters is serviced by the same transformer.

In some embodiments, the root cause may be use of an incorrect meter type if a meter experiences a voltage that is outside a predetermined range of acceptable values.

In certain embodiments, the root cause may be inappropriate socket wiring if a meter experiences a consistent voltage that is outside the predetermined range of acceptable values and the meter is of the correct type of meter required.

In some embodiments, the root cause may be an open or failing secondary or service conductor or connection if one or more meters experiences a sudden decrease in voltage by at least a predetermined amount and if each of the meters is serviced by the same transformer.

In certain embodiments, each meter can have a transformer distance, which is the distance between a meter and the transformer that services the meter. The root cause may be an undersized service conductor if there is a correlation between the transformer distances of meters serviced by a particular transformer and a decrease in voltage in at least some of the meters, and if the decrease in voltage is at least a predetermined percentage below a desired minimum voltage value.

In some embodiments, the root cause may be an undersized service conductor if at least some meters serviced by a particular transformer experience a voltage decrease that is at least a predetermined percentage below a desired minimum voltage value during a high-use period of time. The high-use period of time may be defined as a duration of time during which the voltage decrease is experienced by at least a predetermined percentage of the meters, occurs on a regular basis, and occurs at least a predetermined number of times.

In some embodiments, the root cause may be a regulator on a particular phase if the abnormalities in a predetermined geographic area are experienced by at least a predetermined number of meters that are on a same phase.

An exemplary embodiment of the present invention provides a system that includes a processor and a non-transitory computer-readable medium that stores instructions. When executed by a processor of a computing device, the instructions may cause the processor to receive local data transmitted from a plurality of meters in an electrical grid and identify abnormalities in the received local data. An abnormality may be indicated by local data indicative of a voltage level that is outside of a predetermined range of acceptable levels. The instructions may further cause the processor to associate each of the identified abnormalities with a respective meter and a geographic location of the respective meter and analyze the identified abnormalities according to a predetermined set of evaluation factors to determine a root cause.

In certain embodiments, the non-transitory computer-readable medium may also stores instructions that, when executed by the processor, cause the processor to issue a work order to an appropriate technician based on the root cause.

In some embodiments, the computing device may be operatively connected to a display displaying a map that may identify devices of the electrical grid including conductors, transformers, capacitors, regulators, and meters.

In some embodiments, the map may identify devices that have been determined to be a root cause for an identified abnormality.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

Figure 1:
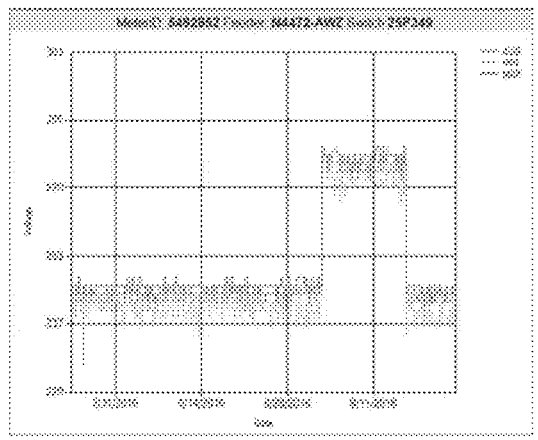
FIG. 1 provides a graphical depiction of a sudden voltage abnormality, as recorded by a meter, in accordance with an exemplary embodiment of the present invention.
Figure 2:
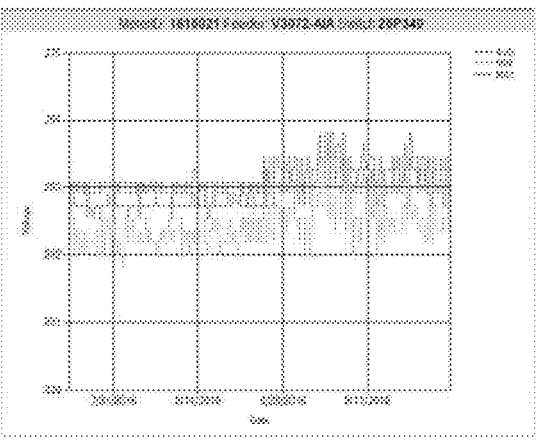
FIG. 2 provides a graphical depiction of a gradual voltage abnormality, as recorded by a meter, in accordance with an exemplary embodiment of the present invention.

To facilitate an understanding of the principles and features of the present invention, various illustrative embodiments are explained below. To simplify and clarify explanation, the invention is described below as applied to identifying and diagnosing an issue in an electrical grid with the use of data recorded by a plurality of meters within the electrical grid. One skilled in the art will recognize, however, that the invention is not so limited.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Electrical utilities maintain electrical grids that commonly include millions of meters. Depending on the frequency with which each meter is programmed to transmit the values it has recorded, electrical utilities can be inundated with hundreds of millions of data points per week. Properly interpreted, these data points can be used to identify individual electrical devices within the electrical grid that have failed and require corrective maintenance or are nearing failure and require preventative maintenance. Therefore, electrical utilities would benefit from a method or system that can evaluate a large amount of data, identify any abnormalities in the data, and accurately diagnose any issues associated with any abnormalities, such that corrective or preventative maintenance may be completed. Further, customers of electrical utilities would also benefit, in that customers would be less likely to incur a power loss should such a method or system be implemented.

Some embodiments of the disclosed technology include novel techniques for determining root causes of issues in an electrical grid. According to certain embodiments, local data, which is measured by each of a plurality of meters within the electrical grid, is received. The local data can include a maximum voltage, a minimum voltage, and an average voltage. In some embodiments, the local data includes other information pertaining to electricity, such as current. In some embodiments, the local data includes information regarding the meter itself, such as a model number for a particular meter. In some embodiments, meters record instantaneously occurring data a predetermined number of times per day. In some embodiments, meters transmit recorded data a predetermined number of times per day. In some embodiments, the transmitted data may represent the whole of a specified time period. For instance, a meter might record data every 15 minutes and might transmit the recorded data four times per day. Continuing this example, one instance of transmitted data might represent a six-hour period that occurs between transmissions by the meter. In certain embodiments, data may be recorded and/or transmitted on an hourly basis. In some embodiments, as few as a single data transmission may be transmitted by a meter during a predetermined time interval; certain embodiments may allocate the transmitted measurement values (e.g., average, maximum, and minimum voltage values) to represent the entire predetermined time interval for the purposes of analysis and/or identification of abnormalities. For example, if a meter is configured to transmit one transmission every six hours, certain embodiments may allocate the data of a single transmission to represent any and/or all times during the respective six-hour period.

It is to be understood that any frequency of data recording by the meters is herein contemplated. Similarly, any frequency of transmission of recorded data by the meters is also herein contemplated. Frequency of recordings and transmissions may be adjusted depending on the level of specificity desired. Increased frequency may result in data that more closely resembles the actual values experienced at a meter but will also increase the amount of resultant data. Decreased frequency may result in data that less closely resembles the actual values experienced at a meter but will decrease the amount of resultant data, making management of the data more manageable. There may be recording and transmission frequencies that sufficiently reflect the actual values experienced at the meter, while providing a minimal amount of data, thus increasing the ease of data management.

According to certain embodiments, identification of abnormalities in the received local data may be made. An abnormality may be indicated by local data indicative of a voltage level that is outside of a predetermined range of acceptable levels. In some embodiments, an association of each identified abnormality with a respective meter may be made. In some embodiments, an association of each identified abnormality with a geographic location of the respective meter may also be made.

In certain embodiments, analysis of each of the identified abnormalities may be performed according to a predetermined set of evaluation factors. In some embodiments, this step includes identifying whether each of the identified abnormalities is associated with a maximum voltage value, a minimum voltage value, and/or an average voltage value. In some embodiments, this step includes identifying a severity and duration of each of the identified abnormalities. In some embodiments, this step includes associating each of the identified abnormalities from a particular meter with each of the identified abnormalities in nearby meters with respect to geospatial location of the meters with respect to one another, as well as the location of the meters with respect to one another within the electrical grid.

Some embodiments may include a filtering function, which can filter out false positive values that may be triggered due to normal fluctuations in voltages within the electrical grid. In some embodiments, a filtering function may limit identification of a root cause to only those abnormalities that exist for at least a predetermined percentage of time. In some embodiments, a filtering function may limit identification of a root cause to only those abnormalities that occur for at least a predetermined number of times. It should be noted that throughout this disclosure, including the claims, requirements with respect to the frequency of an abnormality occurring includes both (i) the existence of the abnormality for at least a predetermined percentage of time within a specified time period (which may be a rolling time period) and (ii) an abnormality that occurs at least a predetermined number of times.

In certain embodiments, the root cause may be identifiable from the local data of a single meter. For instance, local data may indicate that a meter reporting an abnormality is a legacy device, i.e., the model of that particular meter is outdated. Thus, the root cause may be resolved by replacing the outdated meter with a current model of meter.

In some embodiments, the root cause may be identified as a meter that requires reprogramming if a meter reports an average voltage value that is not between the reported minimum voltage value and the reported maximum voltage value.

In certain embodiments, the root cause may be identifiable by relating values reported by a meter to values reported by other meters. For instance, the root cause may be identified as voltage supplied from a transmission line to a pole- or pad-mount substation if at least predetermined number or percentage of meters that are reporting abnormalities are served from a point that does not provide voltage regulation.

In some embodiments of the present invention, a predetermined number or percentage of the meters serviced by the same transformer experiencing an abnormality is indicative of a root cause being a malfunctioning transformer. For example, in some embodiments of the invention, multiple meters serviced by the same transformer experiencing an abnormality is indicative of a root cause being a malfunctioning transformer. In some embodiments, 1, 2, 3, 4, 5, or more meters serviced by the same transformer experiencing an abnormality is indicative of a root cause being a malfunctioning transformer. In some embodiments, 10%, 15%, 20%, 25%, 30%, 35%, 40%, 45%, 50%, 55%, 60%, 65%, 70%, 75%, or more meters serviced by the same transformer experiencing an abnormality is indicative of a root cause being a malfunctioning transformer.

Figure 4:
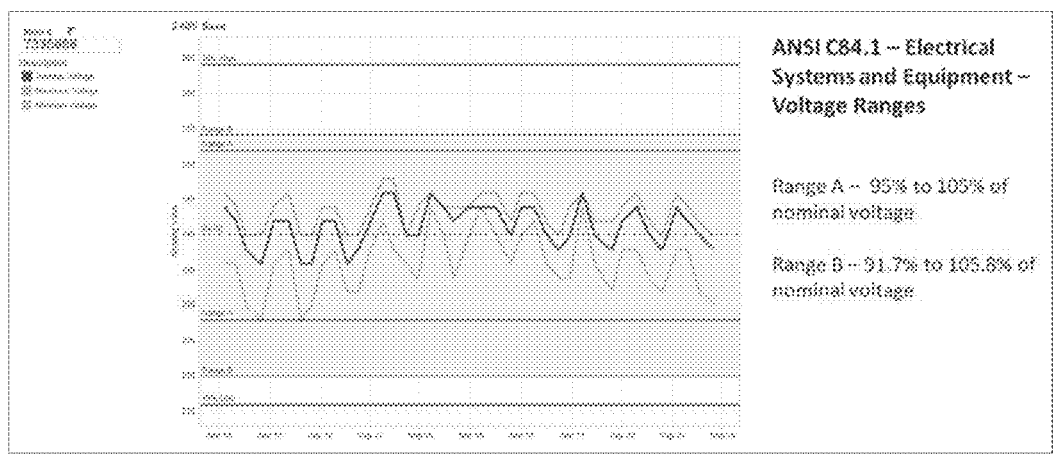
FIG. 4 provides a graphical depiction of average voltage, maximum voltage, and minimum voltage values, as recorded by a meter operating within a generally acceptable voltage range, in accordance with an exemplary embodiment of the present invention.
Figure 5:
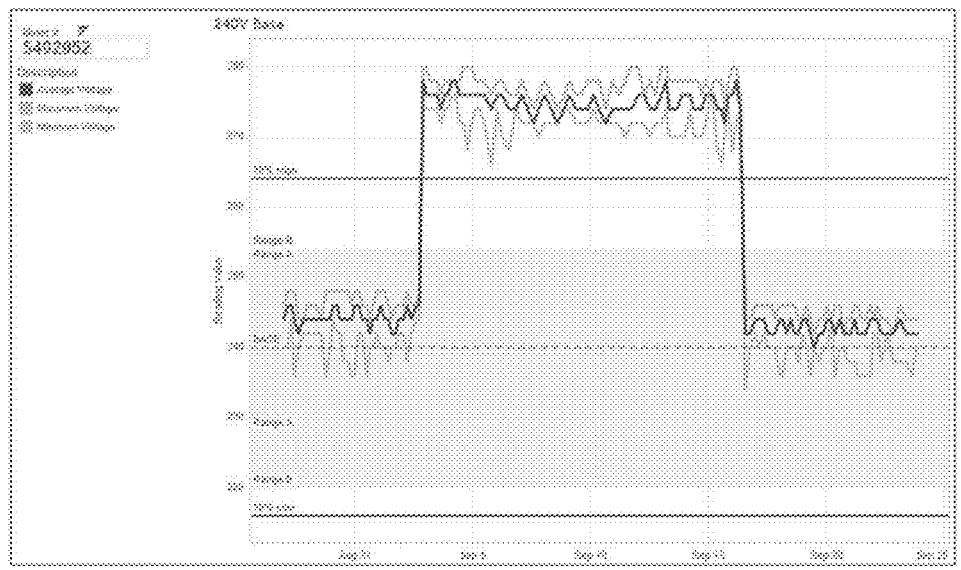
FIG. 5 provides a graphical user interface of average voltage, maximum voltage, and minimum voltage values, as recorded by a meter with an excursion outside a generally acceptable voltage range, in accordance with an exemplary embodiment of the present invention.

In certain embodiments, a transformer may soon fail if at least a predetermined number or percentage or number of meters serviced by a transformer experience a sudden increase in voltage. In some embodiments, meters must experience a sudden increase in voltage by at least a predetermined amount in order for a root cause of a failing transformer to be identified. A graphical depiction of the values recorded by a meter serviced by a failing transformer is shown in FIG. 5. For the purpose of comparison, a graphical depiction of generally normal values recorded by a meter is shown in FIG. 4. In some embodiments, 1, 2, 3, 4, 5, or more meters serviced by the same transformer experiencing a sudden increase in voltage is indicative of a transformer nearing failure. In some embodiments, 10%, 15%, 20%, 25%, 30%, 35%, 40%, 45%, 50%, 55%, 60%, 65%, 70%, 75%, or more meters serviced by the same transformer experiencing a sudden increase in voltage is indicative of a transformer nearing failure.

In some embodiments, the root cause may be identified as a malfunctioning voltage regulation device if at least a predetermined number or percentage of transformers service at least a predetermined number or percentage of meters experiencing an abnormality. In some embodiments, the number or percentage of transformers may be relatively high, and the number or percentage of meters experiencing an abnormality may be relatively low. For instance, a large number of transformers, such as 5, 10, or more, may each service as few as a single meter that is experiencing an abnormality. In some embodiments, the number or percentage of transformers may be relatively low, and the number or percentage of meters experiencing an abnormality may be relatively high. For instance, few transformers, such as 2, 3, 4, or more transformers, may each service a plurality of meters, and at least 1%, 2%, 5%, 10% or more of the plurality corresponding to each of the few transformers experiences an abnormality.

In certain embodiments, an incorrect meter type may be in use if a meter experiences a consistent voltage that is outside of a predetermined range of acceptable values.

In some embodiments, inappropriate socket wiring may be identified as the root cause if a meter experiences a consistent voltage that is outside of a predetermined range of acceptable values and the meter is of the correct type of meter required.

In some embodiments, the root cause may be an open or failing secondary or service conductor or connection if one or more meters that are serviced by the same transformer experiences a sudden decrease in voltage by at least a predetermined amount.

In certain embodiments, each meter may be assigned a transformer distance, which is the distance between a meter and the transformer that services the meter. The root cause may, in some embodiments, be an undersized service conductor if there is a correlation between the transformer distances of meters serviced by a particular transformer and a decrease in voltage in at least some of the meters serviced by that transformer. The decrease in voltage may be at least a predetermined amount or percentage below a desired minimum voltage value.

In some embodiments, the root cause may be a malfunctioning regulator on a particular phase if the abnormalities in a predetermined geographic area or a predetermined portion of the electrical grid are experienced by at least a predetermined number or percentage of meters that are on the same phase. In some embodiments, 3, 4, 5, or more meters that are on the same phase experiencing an abnormality is indicative of a root cause being a malfunctioning regulator on a particular phase. In some embodiments, 10%, 15%, 20%, 25%, 30%, 35%, 40%, 45%, 50%, 55%, 60%, 65%, 70%, 75%, or more meters that are on the same phase experiencing an abnormality is indicative of a root cause being a malfunctioning regulator on a particular phase.

According to some embodiments, a system is provided, which includes a processor and a non-transitory computer readable medium that stores instructions. In some embodiments, this system is software saved in memory on a computer. In some embodiments, this system is saved on a physical disk or other medium. These instructions, when executed by a processor of a computer or other computing device, may cause the processor to receive local data transmitted from a plurality of meters in an electrical grid and identify abnormalities in the received data. An abnormality, as explained above, is indicated by local data indicative of a voltage level that is outside of a predetermined range of acceptable values. The instructions may also associate each of the identified abnormalities with a respective meter and a location of the respective meter. The location may be geographical, with respect to the electrical grid itself, or both.

The instructions may also analyze the identified abnormalities according to a predetermined set of evaluation factors to determine a root cause. In some embodiments, the instructions also cause the processor to issue a work order to an appropriate technician depending on the root cause identified by the system. This may help to ensure that the correct technician is dispatched the first time, which may mitigate or eliminate waste of money and resources that is caused by dispatching an incorrect technician.

Figure 3:
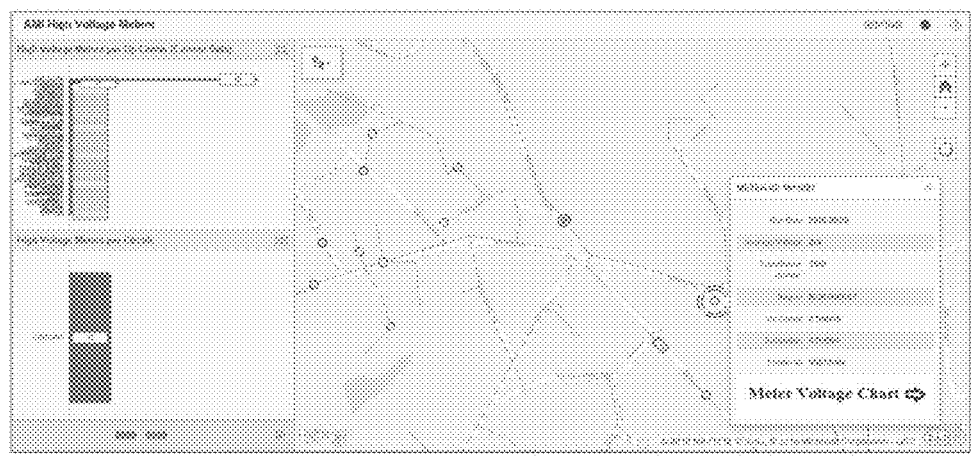
FIG. 3 provides a graphical user interface of a computer system depicting a map with an electrical grid overlay, in accordance with an exemplary embodiment of the present invention.

In certain embodiments, the computing device is operatively connected to a display the can display a map that can identify devices of the electrical grid. These devices can include conductors, transformers, capacitors, regulators, and meters. In some embodiments, the map may identify devices that have been determined to be a root cause for an identified abnormality. This may be done in a variety of ways including differentiating problematic devices from other devices by use of different colors, different symbols or icons, etc. An example of an embodiments including a map display is shown in FIG. 3.

In some embodiments, the computing device may generate a report including the highest priority of identified root causes. The highest priority of identified root causes may be based on a number of criteria including monetary cost of the associated device and number of customers affected by failure of the associated device.

In some embodiments, a graphical depiction of readings received from a particular meter is displayed via the display. As shown in FIG. 4, in some embodiments, the graphical depiction may also include related information, such as regulative requirements. This may aid engineers or other employees of an electrical utility in manually identifying abnormalities, such as a failing transformer, an example of which is shown in FIG. 5.

In some embodiments, the system is configured to provide daily updates. In some embodiments, updates are provided more frequently; in some embodiments, updates are provided less frequently.

In some embodiments, the system may be configured to operative in conjunction with existing software and services commonly used by electrical utilities. These software and services may include MicrosoftSQL Server Integration Services; AMI; Esri Geographic Information Systems; maps services, such as Google Maps or Bing Maps; and Datazen.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention be defined by the claims appended hereto.

We claim:

1. A method for determining root causes of issues in an electrical grid comprising:
    receiving, from each of a plurality of meters, local data, the local data indicative of voltage levels measured by the plurality of meters;
    identifying abnormalities in the received local data, wherein an abnormality is indicated by local data indicative of a voltage level that is outside of a predetermined range of acceptable levels;
    associating each of the identified abnormalities with a respective meter and a geographic location of the respective meter;
    analyzing each of the identified abnormalities according to a predetermined set of evaluation factors to determine a root cause by:
        identifying whether each of the identified abnormalities is associated with a maximum voltage value, a minimum voltage value, and/or an average voltage value;
        identifying a severity and duration of each of the identified abnormalities;
        associating each of the identified abnormalities from a particular meter in the plurality of meters with each of the identified abnormalities from other meters in the plurality of meters in a predetermined geographic vicinity, wherein the predetermined geographic vicinity is predetermined by geography and a layout of an electrical grid; and
        determining the root cause based at least in part on one or more of the maximum voltage value, the minimum voltage value, the average voltage value, the severity and duration of one or more of the identified abnormalities, and association of the identified abnormalities of the particular meter with the identified abnormalities from the other meters in the predetermined geographic vicinity; and
    generating, based on the determined root cause and for display on a display device, display data indicating one or more root causes and one or more electrical grid devices associated with each root cause of the one or more root causes.

2. The method of claim 1, wherein each meter transmits local data that the meter recorded over a specified time period, the local data comprising a maximum voltage value, a minimum voltage value, and an average voltage value.

3. The method of claim 2, wherein the local data is further indicative of a model of each of the plurality of meters, and the root cause is a meter that requires replacement if the model of the meter is outdated.

4. The method of claim 1, further comprising filtering out false positive values by limiting identification of the root cause to only those abnormalities that exist for at least a predetermined time requirement.

5. The method of claim 1, wherein the root cause is a meter that requires reprogramming if the average voltage value transmitted by the meter is not between the minimum voltage value and maximum voltage value transmitted by the meter.

6. The method of claim 1, wherein the root cause is voltage supplied from a transmission line to a pole- or pad-mount substation if at least predetermined number or percentage of meters reporting abnormalities are served from a point that does not provide voltage regulation.

7. The method of claim 1, wherein the root cause is a malfunctioning transformer if at least a predetermined number or percentage of the meters serviced by a particular transformer experience an abnormality.

8. The method of claim 1, wherein the root cause is a malfunctioning voltage regulating device if at least a first predetermined number of transformers service at least a second predetermined number of meters that experience an abnormality.

9. The method of claim 1, wherein the root cause is impending failure of a transformer if at least a predetermined number or percentage of a plurality of meters experiences a sudden increase in voltage by at least a predetermined amount, wherein each of the plurality of meters is serviced by the same transformer.

10. The method of claim 1, wherein the root cause is use of an incorrect meter type if a meter experiences a voltage that is outside a predetermined range of acceptable values.

11. The method of claim 1, wherein the root cause is inappropriate socket wiring if a meter experiences a consistent voltage that is outside the predetermined range of acceptable values and the meter is of the correct type of meter required.

12. The method of claim 1, wherein the root cause is an open or failing secondary or service conductor or connection if one or more meters experiences a sudden decrease in voltage by at least a predetermined amount, wherein each of the meters is serviced by the same transformer.

13. The method of claim 1, wherein each meter has a transformer distance, the transformer distance being a distance between a meter and a transformer that services the meter; and
    wherein the root cause is an undersized service conductor if there is a correlation between the transformer distances of meters serviced by a particular transformer and a decrease in voltage in at least some of the meters, wherein the decrease in voltage is at least a predetermined percentage below a desired minimum voltage value.

14. The method of claim 1, wherein the root cause is an undersized service conductor if at least some meters serviced by a particular transformer experience a voltage decrease that is at least a predetermined percentage below a desired minimum voltage value during a high-use period of time,
wherein the high-use period of time is defined as a duration of time during which the voltage decrease is experienced by at least a predetermined percentage of the meters, the voltage decrease occurring on a regular basis and occurring at least a predetermined number of times.

15. The method of claim 1, wherein the root cause is a malfunctioning regulator on a particular phase if the abnormalities in a predetermined geographic area are experienced by at least a predetermined number of meters that are on a same phase.

16. A system comprising:
a processor;
a non-transitory computer-readable medium that stores instructions that, when executed by a processor of a computing device, cause the processor to:
receive local data transmitted from a plurality of meters in an electrical grid;
identify abnormalities in the received local data, wherein an abnormality is indicated by local data indicative of a voltage level that is outside of a predetermined range of acceptable levels;
associate each of the identified abnormalities with a respective meter and a geographic location of the respective meter;
analyze the identified abnormalities according to a predetermined set of evaluation factors to determine a root cause by:
identifying whether each of the identified abnormalities is associated with a maximum voltage value, a minimum voltage value, and/or an average voltage value;
identifying a severity and duration of each of the identified abnormalities; and
associating each of the identified abnormalities from a particular meter in the plurality of meters with each of the identified abnormalities from other meters in the plurality of meters in a predetermined geographic vicinity, wherein the predetermined geographic vicinity is predetermined by geography and a layout of an electrical grid;
generate, based on the determined root cause, display data indicating one or more root causes and one or more electrical grid devices associated with each root cause of the one or more root causes, the one or more electrical grid devices including at least one of a conductor, a transformer, a capacitor, a regulator, and a meter; and
determine the root cause based at least in part on one or more of the maximum voltage value, the minimum voltage value, the average voltage value, the severity and duration of one or more of the identified abnormalities, and association of the identified abnormalities of the particular meter with the identified abnormalities from the other meters in the predetermined geographic vicinity; and
a display operatively connected to the computing device, the display configured to display a map including the display data.

17. The system of claim 16, wherein the non-transitory computer-readable medium further stores instructions that, when executed by the processor, cause the processor to issue a work order to an appropriate technician based on the root cause.

18. The system of claim 16, wherein the map identifies the location of devices identified as reporting abnormalities in relationship to devices that have been determined to be a root cause for an identified abnormality.

* * * * *